United States Patent
Li

(10) Patent No.: US 11,404,551 B2
(45) Date of Patent: Aug. 2, 2022

(54) TRENCH-GATE TRANSISTOR WITH GATE DIELECTRIC HAVING A FIRST THICKNESS BETWEEN THE GATE ELECTRODE AND THE CHANNEL REGION AND A SECOND GREATER THICKNESS BETWEEN THE GATE ELECTRODE AND THE SOURCE/DRAIN REGIONS

(71) Applicant: Changxin Memory Technologies, Inc., Anhui (CN)

(72) Inventor: Ning Li, Anhui (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/001,212

(22) Filed: Aug. 24, 2020

(65) Prior Publication Data
US 2021/0050426 A1 Feb. 18, 2021

Related U.S. Application Data

(63) Continuation of application No. PCT/CN2019/077501, filed on Mar. 8, 2019.

(30) Foreign Application Priority Data

Mar. 9, 2018 (CN) .......................... 201810196012.4

(51) Int. Cl.
*H01L 29/423* (2006.01)
*H01L 21/02* (2006.01)
(Continued)

(52) U.S. Cl.
CPC .. *H01L 29/42368* (2013.01); *H01L 21/02233* (2013.01); *H01L 21/26533* (2013.01);
(Continued)

(58) Field of Classification Search
CPC ......... H01L 21/26533; H01L 21/26586; H01L 21/2822; H01L 27/10823; H01L 27/10876;
(Continued)

(56) References Cited

U.S. PATENT DOCUMENTS

2009/0176342 A1  7/2009 Lee et al.
2009/0321805 A1  12/2009 von Kluge et al.
(Continued)

FOREIGN PATENT DOCUMENTS

CN         108511518 A      9/2018
KR    10-2009-0039203 A     4/2009
KR       20090039203 A  *  4/2009

OTHER PUBLICATIONS

PCT International Search Report and the Written Opinion dated Jun. 12, 2019, issued in related International Application No. PCT/CN2019/077501 (9 pages).

*Primary Examiner* — Marcos D. Pizarro
(74) *Attorney, Agent, or Firm* — Sheppard Mullin Richter & Hampton LLP

(57) ABSTRACT

The present disclosure provides a transistor, a transistor forming method thereof, and a semiconductor device. The transistor forming method comprises providing a substrate, the substrate comprising a first region for forming a source region and a second region for forming a drain region; forming a gate groove in the substrate to separate the first region and the second region, a part of the substrate along the bottom of the gate groove being used for constituting an embedded channel region of a transistor; forming a gate dielectric layer on the gate groove of the substrate to cover the embedded channel region and to extend to cover a side of the first region and a side of the second region in the gate (Continued)

groove; and forming a gate conductive layer on the gate dielectric layer of the substrate and in the gate groove.

12 Claims, 11 Drawing Sheets

(51) Int. Cl.
| | |
|---|---|
| H01L 21/265 | (2006.01) |
| H01L 29/66 | (2006.01) |
| H01L 29/78 | (2006.01) |
| H01L 29/10 | (2006.01) |
| H01L 27/108 | (2006.01) |

(52) U.S. Cl.
CPC .. *H01L 21/26586* (2013.01); *H01L 27/10808* (2013.01); *H01L 27/10823* (2013.01); *H01L 27/10876* (2013.01); *H01L 29/1037* (2013.01); *H01L 29/4236* (2013.01); *H01L 29/66734* (2013.01); *H01L 29/7813* (2013.01)

(58) Field of Classification Search
CPC ............ H01L 29/1037; H01L 29/4236; H01L 29/42368; H01L 29/66621; H01L 27/10808

See application file for complete search history.

(56) References Cited

U.S. PATENT DOCUMENTS

| | | |
|---|---|---|
| 2011/0018057 A1 | 1/2011 | Kim |
| 2011/0169066 A1 | 7/2011 | Moon et al. |
| 2018/0190661 A1* | 7/2018 | Wang ................ H01L 21/28088 |
| 2019/0035792 A1* | 1/2019 | Lu ....................... H01L 29/4236 |

* cited by examiner

Provide a substrate, where the substrate includes a first region for forming a source region and a second region for forming a drain region, and a part of the substrate from the first region to the second region being used for constituting a channel region of a transistor — S100

Form a gate dielectric layer on the substrate, where a part of the gate dielectric layer that covers the channel region constitutes a first portion of the gate dielectric layer, a part of the gate dielectric layer that covers the first region and the second region constitutes a second portion of the gate dielectric layer, and an average thickness of the second portion of the gate dielectric layer is greater than that of the first portion of the gate dielectric layer — S200

Form a gate conductive layer on the gate dielectric layer of the substrate, where the gate conductive layer extends from the first dielectric layer of the gate dielectric layer to the second dielectric layer so that the gate conductive layer has a region overlapping with the first region and the second region respectively — S300

FIG. 3

TRENCH-GATE TRANSISTOR WITH GATE DIELECTRIC HAVING A FIRST THICKNESS BETWEEN THE GATE ELECTRODE AND THE CHANNEL REGION AND A SECOND GREATER THICKNESS BETWEEN THE GATE ELECTRODE AND THE SOURCE/DRAIN REGIONS

CROSS-REFERENCE TO RELATED APPLICATIONS

This application is a continuation application of International Patent Application No. PCT/CN2019/077501, filed on Mar. 8, 2019, which is based on and claims priority of Chinese Patent Application No. 201810196012.4, filed with the State Intellectual Property Office (SIPO) of the People's Republic of China on Mar. 9, 2018. The above-referenced applications are incorporated herein by reference in their entirety.

TECHNICAL FIELD

The present disclosure relates to the technical field of semiconductors, in particular, to a transistor, a forming method thereof, and a semiconductor device.

BACKGROUND

As the size of a semiconductor device is being continuously reduced, the feature size of a field effect transistor is also being reduced rapidly, and the corresponding gate dielectric layer is becoming thinner. Reliability issues caused by the thin gate dielectric layer also become increasingly noteworthy.

As the transistor device becomes thinner and thinner, a Gate-induced Drain Leakage (GIDL) caused by the transistor in a closed state or a waiting state is increasingly severe, which can have negative effect on the reliability of the transistor, lead to instability of the transistor, and increase the static power consumption of the transistor. At the same time, since GIDL severely restricts the reduction of the thickness of the gate dielectric layer, it also limits shrinkage of the size of the transistor.

Therefore, as the integration level of the integrated circuit is increasing and the feature size of the transistor is being continuously reduced, reducing the leakage current of the device has become a key issue for high density and low power consumption semiconductor technology.

SUMMARY

A purpose of the present disclosure is to provide a transistor forming method so that the formed transistor has a small leakage current.

The transistor forming method provided by the present disclosure includes:

providing a substrate, the substrate including a first region for forming a source region and a second region for forming a drain region;

forming a gate groove in the substrate to separate the first region and the second region, a part of the substrate along the bottom of the gate groove being used for constituting an embedded channel region of a transistor;

forming a gate dielectric layer on the gate groove of the substrate to cover the embedded channel region and to extend to cover a side of the first region and a side of the second region in the gate groove; where a part of the gate dielectric layer that covers the channel region constitutes a first portion of the gate dielectric layer, a part of the gate dielectric layer that covers the first region and the second region constitutes a second portion of the gate dielectric layer, and an average thickness of the second portion of the gate dielectric layer is greater than that of the first portion of the gate dielectric layer; and forming a gate conductive layer on the gate dielectric layer of the substrate and in the gate groove, the gate conductive layer extending from the first portion to the second portion of the gate dielectric layer so that the gate conductive layer has a region overlapping with the first region and the second region respectively.

In some embodiments, before forming the gate groove, the method further includes: performing an ion injection process on the substrate to form a doped region in both the first region and the second region of the substrate, the doped region extending from a top surface of the substrate to an inner part of the substrate; and after forming the gate groove, using the gate groove to separate the first region and the second region, and using the doped region in the first region to constitute the source region and the doped region in the second region to constitute the drain region.

In some embodiments, forming the gate dielectric layer includes:

performing an inclined ion injection process at least twice to form a variation region on sidewalls of the gate groove adjacent to an opening part, where the at least twice inclined ion injection process includes performing ion injection between the first region and the second region in opposite deviation directions respectively, so as to form the variation region on both the sidewall of the gate groove adjacent to the first region and the sidewall of the gate groove adjacent to the second region; and performing an oxidization process to form the gate dielectric layer on a bottom and the sidewalls of the gate groove, where a part of the gate dielectric layer that does not correspond to the variation region has a first thickness, a part of the gate dielectric layer that corresponds to the variation region has a second thickness, and an oxidization rate of a part of the gate groove that corresponds to the variation region is greater than that of a part of the gate groove that does not correspond to the variation region, so that the second thickness is greater than the first thickness.

In some embodiments, the variation region extends from the first region and the second region to a part of the channel region, so that the part of the gate dielectric layer that corresponds to the channel region and is adjacent to the first region and the second region has the second thickness.

In some embodiments, injected ions of the inclined ion injection process include fluorine ions.

In some embodiments, forming the gate conductive layer includes:

forming a conductive material layer on the substrate, the conductive material layer covering the substrate and filling the gate groove; and performing a back-etching process on the conductive material layer, removing the part of the conductive material that covers the substrate and retaining the part of the conductive material layer that fills the gate groove to constitute the gate conductive layer.

In some embodiments, a top of the gate conductive layer is lower than an opening part of the gate groove, to form an accommodating space in the gate groove and above the gate conductive layer, and the transistor forming method further includes:

filling an insulation layer in the accommodating space of the gate groove to cover the gate conductive layer.

In some embodiments, the average thickness of the first portion of the gate dielectric layer is less than 3 nm, and the average thickness of the second portion of the gate dielectric layer is greater than or equal to 3 nm.

In some embodiments, the first portion of the gate dielectric layer has a first thickness and a second thickness, the first portion of the gate dielectric layer has the second thickness at a junction of the overlapping region and the channel region, and from the junction of the overlapping region and the channel region to a center of the channel region, the first portion is reduced from the second thickness to the first thickness.

Another purpose of the present disclosure is to provide a transistor, including:

a substrate, a source region and a drain region in the substrate, and a gate groove between the source region and the drain region being formed in the substrate, and a bottom of the gate groove in the substrate being lower than the source region and the drain region to constitute an embedded channel region of the transistor;

a gate dielectric layer covering a part of the substrate that corresponds to the embedded channel region and extending to cover a side of the source region and a side of the drain region in the gate groove; where a part of the gate dielectric layer that covers the channel region constitutes a first portion of the gate dielectric layer, a part of the gate dielectric layer that covers the sides of the source region and the drain region in the gate groove constitutes a second portion of the gate dielectric layer, and an average thickness of the second portion of the gate dielectric layer is greater than that of the first portion of the gate dielectric layer; and a gate conductive layer on the gate dielectric layer of the substrate and in the gate groove, the gate conductive layer extending from the first portion to the second portion of the gate dielectric layer so that the gate conductive layer has a region overlapping with the source region and the drain region respectively.

In some embodiments, the source region and the drain region both are adjacent to an opening part of the gate groove, and side edge boundaries of the source region and the drain region extend to sidewalls of the gate groove adjacent to the opening part respectively;

the gate dielectric layer cover a bottom and the sidewalls of the gate groove, and the second portion of the gate dielectric layer covers a part of the gate groove adjacent to the opening part so that the second portion covers parts of the source region and the drain region that extend to the sidewalls of the gate groove; and the gate conductive layer fills the gate groove, and a part in the gate conductive layer that is adjacent to the opening part of the gate groove has the overlapping region with the source region and the drain region.

In some embodiments, the source region and the drain region both extend from a top surface of the substrate towards an inner part of the substrate to a first depth, a top surface of the gate conductive layer is not higher than the top surface of the substrate and is located at a second depth of the substrate, and the first depth is greater than the second depth so that the source region and the drain region overlap with the gate conductive layer in a range from the first depth to the second depth respectively.

In some embodiments, a top of the gate conductive layer is lower than the opening part of the gate groove to form an accommodating space in the gate groove and above the gate conductive layer, and the transistor further includes:

an insulation layer filled in the accommodating space of the gate groove to cover the gate conductive layer.

In some embodiments, the average thickness of the first portion of the gate dielectric layer is less than 3 nm, and the average thickness of the second portion of the gate dielectric layer is greater than or equal to 3 nm.

In some embodiments, the transistor further comprises an isolation layer on the substrate, and the isolation layer covers the top surface of the substrate that corresponds to the source region and the drain region.

In some embodiments, the transistor further comprises a well region in the substrate, and the source region and the drain region are both in the well region.

In some embodiments, the first portion (110a) of the gate dielectric layer has a first thickness and a second thickness, the second portion (110b) has the second thickness, a part of the first portion that has the second thickness is located at a junction of the overlapping region (D) and the channel region (C), and from the junction of the overlapping region and the channel region to a center of the channel region, the first portion is reduced from the second thickness to the first thickness.

A further purpose of the present disclosure is to provide a semiconductor device, and the semiconductor device includes the transistor as described above.

In some embodiments, the semiconductor device is a memory and the transistor constitutes a memory transistor of the memory.

In some embodiments, the memory has at least one active region, and the memory transistor is in the at least one active region.

In some embodiments, two memory transistors are within one of the at least one active region of the memory, and the two memory transistors share a source region.

In the transistor provided in the present disclosure, the gate dielectric layer has different thicknesses in different portions, i.e., the gate dielectric layer has a greater thickness in the region where the gate conductive layer and the source region/drain region overlap so as to effectively reduce GIDL of the transistor; moreover, in increasing the thickness of the gate dielectric layer corresponding to the overlapping region, the thickness of the gate dielectric layer corresponding to the channel region is not substantially changed so as to ensure the switching performance of the transistor. Accordingly, consistent with the trend of continuous reduction of device sizes, the transistor provided in the present disclosure can effectively reduce current leakage without changing the threshold voltage thereof so as to improve the overall performance of the transistor.

BRIEF DESCRIPTION OF THE DRAWINGS

FIG. 3 is a flow diagram of a transistor forming method in some embodiments of the present disclosure.

Figure 1A:
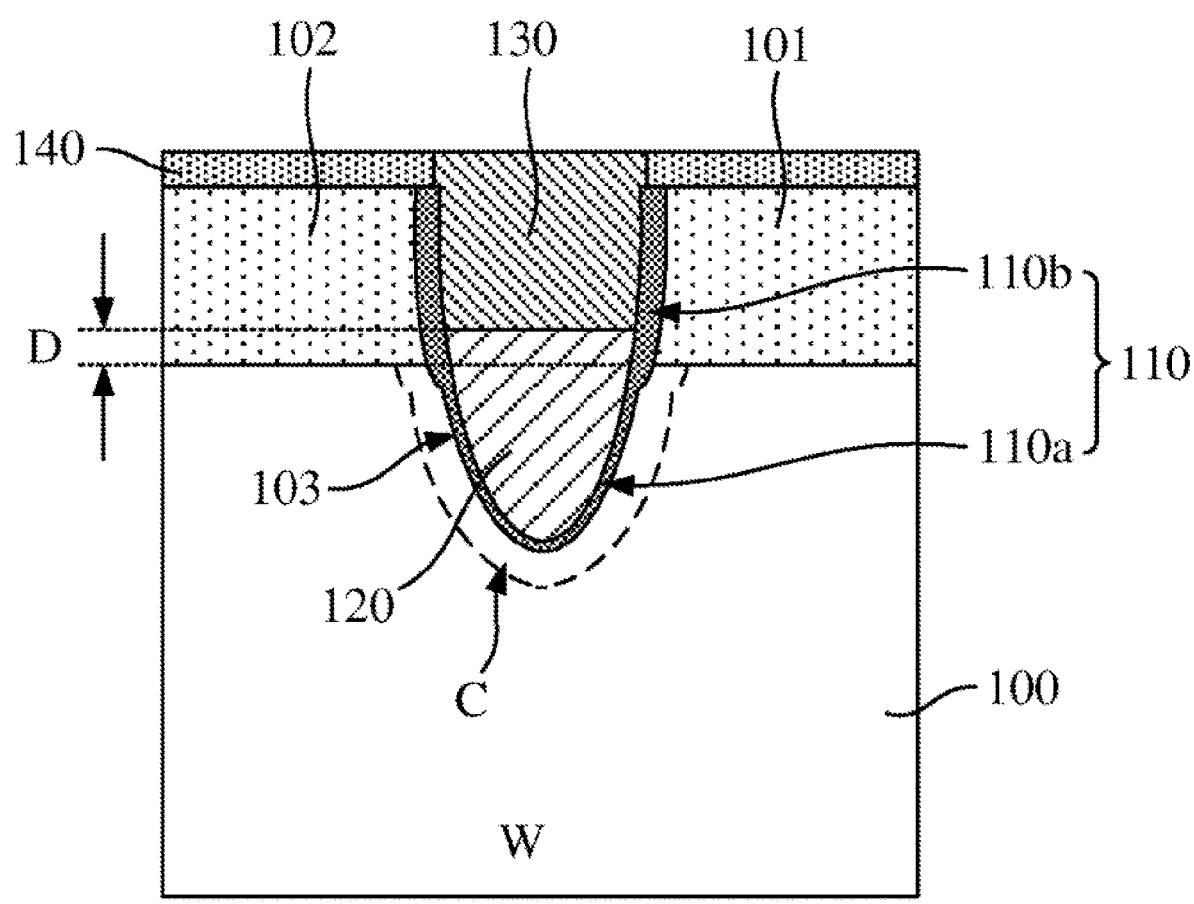
FIG. 1A is a structural schematic diagram of a transistor in some embodiments of the present disclosure.

The reference numerals are as follows:
100/200: substrate; 200a: doped region;
101/201: source region; 201a: first region;
102/202: drain region; 202a: second region;
103/203: gate groove; 110/210: gate dielectric layer;
110a/210a: first portion; 110b/210b: second portion;
120/220: gate conductive layer; 130/230: insulation layer;
140/240: isolation layer; 250: separation structure;
206: variation region;
C: channel region; D: overlapping region;
W: well region; AA: active region;
+X: first direction; −X: second direction;
L1: first thickness; L2: second thickness.

DETAIL DESCRIPTION OF THE EMBODIMENTS

To ensure normal functions, existing transistors extend a gate structure thereof to a source region and a drain region. Thus, the gate structure has a region overlapping with both the source region and the drain region. However, because of the overlapping region with the drain region, the GIDL can easily occur and becomes one of the major factors of leakage current of the device.

To solve the technical problem above, a conventional method is to increase the thickness of the gate dielectric layer or use a Lightly-Doping Drain (LDD) technology. However, increasing the thickness of the gate dielectric layer causes an increase in the threshold voltage and power consumption, and using the LDD technology increases production process steps and costs.

Hence, the present disclosure provides a transistor, which may reduce the GIDL without changing the threshold voltage and dynamic power consumption, so as to increase the reliability of the transistor and reduce the static power consumption of the transistor, thereby improving the overall performance of the transistor.

The transistor, the forming method thereof, and the semiconductor device provided by the present disclosure are further described in detail in conjunction with the drawings and embodiments. Advantages and characteristics of the present application will be clearer according to the description below. The drawings may be in a simplified form and use rough proportions, and are merely used to conveniently and clearly assist in illustrating the purposes of embodiments of the present disclosure.

Figure 1B:
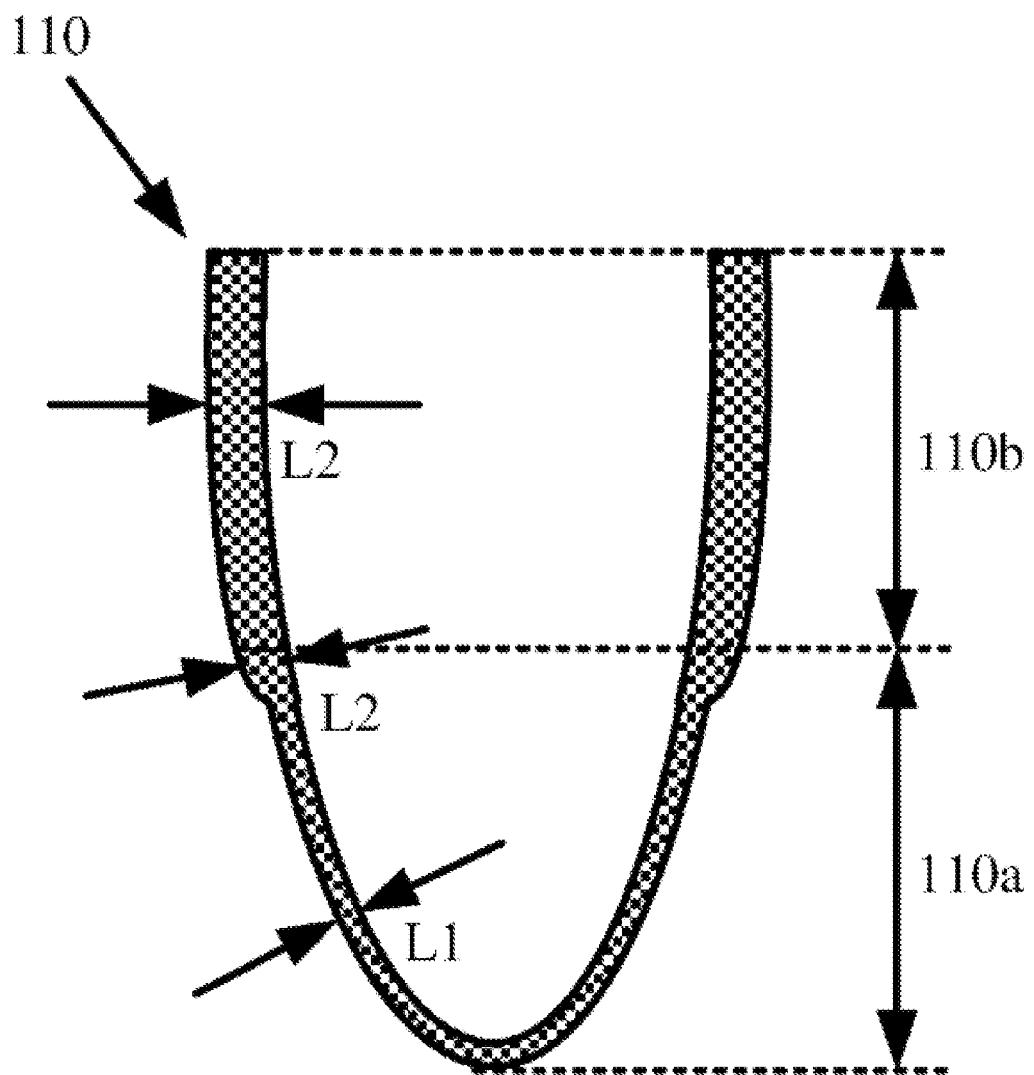
FIG. 1B is an enlarged schematic diagram of a gate dielectric layer of the transistor in FIG. 1A in some embodiments of the present disclosure.

FIG. 1A is a structural schematic diagram of a transistor in some embodiments of the present disclosure; FIG. 1B is an enlarged schematic diagram of a gate dielectric layer of the transistor in FIG. 1A in some embodiments of the present disclosure. As shown in FIG. 1A and FIG. 1B, the transistor includes:

a substrate 100, a source region 101 and a drain region 102 being formed in the substrate 100, and the part of the substrate 100 from the source region 101 to the drain region 102 being used for constituting a channel region C of the transistor;

a gate dielectric layer 110 covering the part of the substrate 100 that corresponds to the channel region C, and extending to cover the source region 101 and the drain region 102; where the part of the gate dielectric layer 100 that corresponds to the channel region C constitutes a first portion 110a of the gate dielectric layer, the part of the gate dielectric layer 110 that covers the source region 101 and the drain region 102 constitutes a second portion 110b of the gate dielectric layer, and an average thickness of the second portion 110b of the gate dielectric layer is greater than that of the first portion 110a of the gate dielectric layer; and a gate conductive layer 120 formed on the gate dielectric layer 110 of the substrate 100, the gate conductive layer 120 that extends from the first portion 110a to the second portion 110b of the gate dielectric layer 110 so that the gate conductive layer 120 has a region D overlapping with the source region 101 and the drain region 102 respectively.

Accordingly, the gate dielectric layer 110 of the transistor has different thicknesses at different portions. In some embodiments, the gate dielectric layer 110 has a first average thickness in the first portion corresponding to the channel region C, and has a second average thickness in the second portion corresponding to the source region 101 and the drain region 102, where the second average thickness is greater than the first average thickness. The average thickness of the first portion 110a of the gate dielectric layer 110 corresponding to the channel region C may be adjusted according to actual requirements of the transistor thereof, so as to ensure that no influence is caused on the conductivity of the transistor and thus the threshold voltage of the transistor does not increase. In addition, the average thickness of the second portion 110b of the gate dielectric layer 110 that corresponds to the source region 101 and the drain region 102 may be correspondingly increased, so that the average thickness of the second portion 110b is greater than the average thickness of the first portion 110a; in this way, the GIDL may be effectively reduced, and the leakage current of the transistor may be reduced, thereby improving the overall performance of the transistor. Accordingly, the transistor provided in the present disclosure may reduce the GIDL of the transistor in addition to ensuring the conductivity of the transistor, thereby improving the overall performance of the transistor. In some embodiments, the second average thickness of the second portion 110b of the gate dielectric layer 110 is, for example, greater than or equal to 3 nm; the first average thickness of the first portion 110a of the gate dielectric layer 110 is, for example, less than 3 nm; and for example, the first average thickness of the first portion 110a may be 2 nm.

Referring to FIG. 1B, in some embodiments, the first portion 110a of the gate dielectric layer 110 has not only a first thickness L1 but also a second thickness L2, where the second thickness is greater than the first thickness. The part of the first portion 110a having the second thickness L2 is at the junction of the overlapping region D and the channel region C, and from the junction of the overlapping region D and the channel region C to the center of the channel region C, the first portion 110a is reduced from the second thickness L2 to the first thickness L1. For example, from the part of the channel region C adjacent to the overlapping region D to the overlapping region D, the thickness of the gate dielectric layer 110 is gradually increased, so that the gate dielectric layer 110 has a relatively large thickness at the boundary of the channel region C (that is, the junction of the channel region C and the overlapping region D), reducing the GIDL of the overlapping region D adjacent to the boundary of the channel region C.

In some embodiments, the average thickness of the second portion 110b is still greater than the average thickness of the first portion 110a which has the first thickness L1 and the second thickness L2.

In some embodiments, the transistor may be a plane-type transistor or a groove-type transistor. Below, the groove-type transistor is used for description and illustration as an example.

Referring to FIG. 1A, a gate groove 103 is formed in the substrate 100; the gate groove 103 is located between the source region 101 and the drain region 102; and the bottom of the gate groove 103 of the substrate is sunk in the source region 101 and the drain region 102 to constitute an embedded channel region of the transistor. The source region 101 and the drain region 102 both are adjacent to an opening part of the gate groove 103, and side edge boundaries of the source region 101 and the drain region 102 extend to sidewalls of the gate groove 103 adjacent to the opening part respectively. The gate dielectric layer 110 cover the bottom and the sidewalls of the gate groove 103, and the gate dielectric layer 110 covers the side of the source region 101 and the side of the drain region 102 in the gate groove 103, where the second portion 110b of the gate dielectric layer 110 covers the part of the gate groove 103 adjacent to the opening part so that the second portion 110b covers parts of the source region 101 and the drain region 102 that extend to the sidewalls of the gate groove 103. Moreover, the gate conductive layer 120 fills the gate groove 103, and the part in the gate conductive layer 120 that is adjacent to the opening part of the gate groove 103 has the region D overlapping with the source region 101 and the drain region 102.

As shown in FIG. 1A, for the groove-type transistor, a gate structure constituted by the gate conductive layer 120 and the gate dielectric layer 110 is formed in the gate groove 103; the source region 101 and the drain region 102 are disposed at both sides of the gate groove 103 respectively; therefore, the embedded channel region C of the transistor is a region from the source region 101 to the drain region 102 along groove sidewalls and the groove bottom of the gate groove 103. When the transistor is turned on, in the region of the substrate 100 adjacent to the sidewalls and bottom of the gate groove 103 (corresponding to the channel region C), a U-shaped conductive channel may be formed in an inversion mode. Therefore, a U-shaped current flow path from the source region 101 and the drain source 102 is present, thereby increasing the length of the conductive channel. In this way, even if the absolute distance between the source region 101 and the drain region 102 is reduced as the size of the memory reduces, since the formed conductive channel is a U-shaped conductive channel, a short channel effect of the transistor may be effectively alleviated.

Furthermore, the source region 101 and the drain region 102 both extend from the top surface of the substrate 100 towards the inner part of the substrate 100 to a first depth of the substrate 100; and the top surface of the gate conductive layer 120 is not higher than the top surface of the substrate 100 and is located at a second depth of the substrate 100. Moreover, the first depth is greater than the second depth, so that the source region 101 and the drain region 102 respectively overlap with the gate conductive layer 120 in a depth range from the first depth to the second depth. The region of the gate conductive layer 120 between the first depth and the second depth constitutes the overlapping region D.

In some embodiments, the top surface of the gate conductive layer 120 is lower than the top surface of the substrate 100. For example, the top surface of the gate conductive layer 120 is lower than the top boundary of the source region 101 and the drain region 102. In this way, the area of the gate conductive layer 120 covering the source region 101 and the drain region 102 may be reduced, thereby effectively alleviating junction current generated by a change in an electric field.

As stated above, the top surface of the gate conductive layer 120 is lower than the top surface of the substrate 100. Thus, the top of the gate conductive layer 120 is lower than the opening part of the gate groove 103, thereby constituting an accommodating space in the gate groove 103 and above the gate conductive layer 120.

In some embodiments, the transistor further includes an insulation layer 130; the insulation layer 130 is filled in the accommodating space of the gate groove 103 to cover the gate conductive layer 120. Using the accommodating space of the gate groove 103 can insulate and protect the gate conductive layer 120 better (for example, a problem of partial exposure of the gate conductive layer 120 caused by displacement deviation of the insulation layer 130 may be avoided). In addition, the insulation layer 130 may be formed through the accommodating space by means of self-alignment, which facilitates simplification of the preparation process.

Still referring to FIG. 1A, a well region W is further formed in the substrate 100; the source region 101 and the drain region 102 are both formed in the well region W; and the ion doping concentration in the well region W is lower than that in the source region 101 and the drain region 102. Moreover, the doping depth of the well region W is lower than the depth of the gate groove 103, so that the gate conductive layer 120 formed in the gate groove 103 is surrounded by the well region W. When the transistor is turned on, a conductive channel is formed in the well region W. Furthermore, the doping type of the well region W may be decided according to the type of the formed transistor. For example, when the transistor is an N-type transistor, the well region W may correspondingly be doped with phosphorus ions (P); when the transistor is a P-type transistor, the well region W may correspondingly be doped with boron ions (B).

In addition, an isolation layer 140 is further formed on the substrate 100; the isolation layer 140 covers the top surface of the substrate 100 that corresponds to the source region 101 and the source region 102 to prevent the source region 101 and the drain region 102 from being exposed from the top surface of the substrate 100, so as to isolate and protect the source region 101 and the drain region 102, and to avoid damages to the source region 101 and the drain region 102 caused during a follow-up production process.

In some embodiments, the gate groove 103 is formed in the substrate 100; thus, the isolation layer 140 may cover the part of the substrate 100 that does not correspond to the gate groove 103. Alternatively, an opening is formed in the isolation layer 140; the opening is aligned with the gate groove 103; the insulation layer 130 fills the opening while filling the gate groove 103, so that the top surface of the insulation layer 130 formed by means of self-alignment is flush with the top surface of the isolation layer 140.

Based on the transistor as described above, the present disclosure further provides a semiconductor device including said transistor. Taking the semiconductor device being a memory as an example, the transistor may be used to constitute the memory transistor of the memory.

Figure 2:
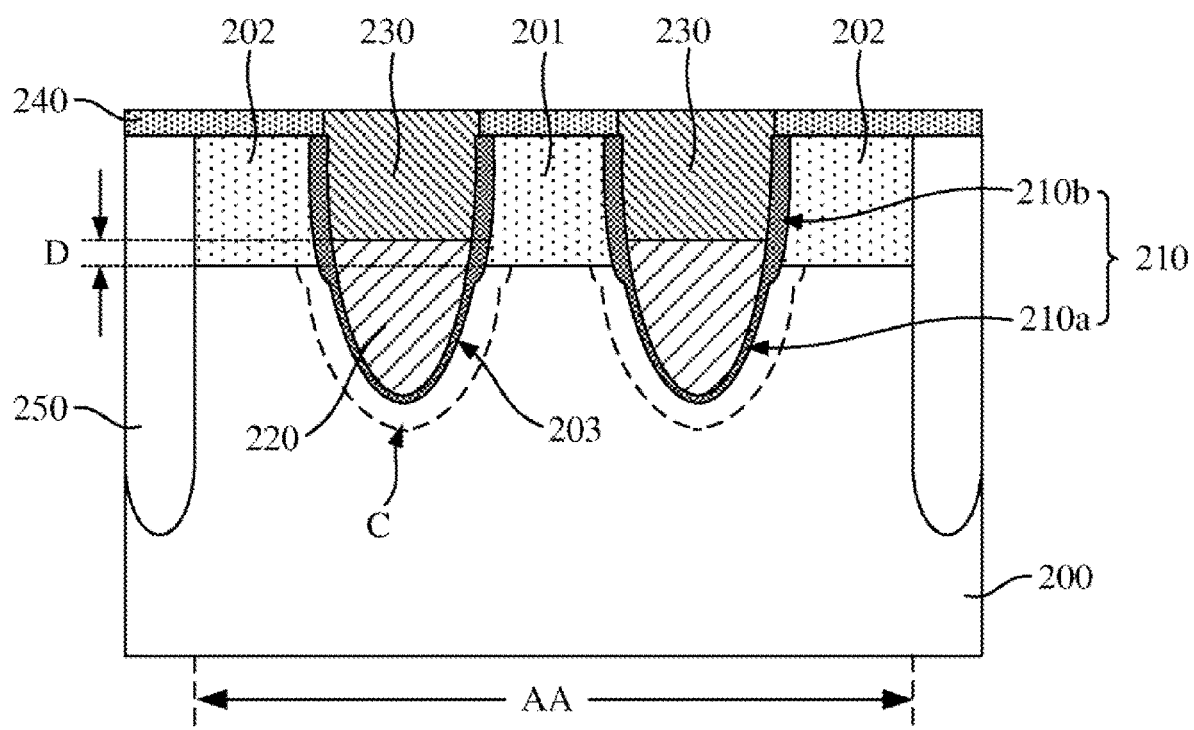
FIG. 2 is a structural schematic diagram of a semiconductor device in some embodiments of the present disclosure.

FIG. 2 is a structural schematic diagram of a semiconductor device in some embodiments of the present disclosure. As shown in FIG. 2, the semiconductor device has at least one active region AA, and the memory transistor is formed in one of the at least one active region AA. For example, the memory has multiple active regions AA, and adjacent active regions AA are separated from each other by a separation structure 250.

For example, the memory transistor includes:
a substrate 200; at least one active region AA being defined on the substrate 200; a source region 201 and a drain region 202 being formed in the active region AA of the substrate 200; and the part of the substrate 200 from the source region 201 to the drain region 202 being used for constituting a channel region C of the memory transistor;

a gate dielectric layer 210 covering the part of the substrate 200 that corresponds to the channel region C and extending to cover the source region 201 and the drain region 202; where the part of the gate dielectric layer 210 that covers the channel region C constitutes a first portion 210a of the gate dielectric layer, the part of the gate dielectric layer 210 that covers the source region 201 and the drain region 202 constitutes a second portion 210b of the gate dielectric layer, and an average thickness of the second portion 210b of the gate dielectric layer is greater than that of the first portion 210a of the gate dielectric layer; and a gate conductive layer 220 formed on the gate dielectric layer 210 of the substrate 200, the gate conductive layer 220 extending from the first portion 210a to the second portion 210b of the gate dielectric layer 210 so that the gate conductive layer 220 has a region D overlapping with the source region 201 and the drain region 202 respectively.

In the memory transistor, the gate dielectric layer 210 thereof has different thicknesses at different positions so that in addition to ensuring the conductivity of the memory transistor (for example, without affecting the threshold voltage of the transistor), the GIDL of the memory transistor may be improved to reduce the leakage current of the memory transistor, thereby improving the overall performance of the memory transistor and correspondingly improving the performance of the semiconductor device. The average thickness of the first portion 210a of the gate dielectric layer 210 is, for example, less than 3 nm, and the average thickness of the second portion 210b of the gate dielectric layer 210 is, for example, greater than or equal to 3 nm.

In some embodiments, the transistor is used for constituting a memory transistor of a memory, and therefore, the gate conductive layer 220 may be correspondingly connected to word lines of the memory, the source region 201 may be correspondingly connected to bit lines of the memory, and the drain region 202 may be connected to a capacitor of the memory.

Still referring to FIG. 2, two memory transistors are formed in one of the active regions AA of the memory, and the two memory transistors share a source region 201 to constitute a memory transistor pair.

Similar to the embodiments described above, the memory transistor is a groove-type transistor, to increase the density of the storage units in the memory. A gate groove 203 is formed in the substrate 200, and the gate dielectric layer 210 and the gate conductive layer 220 are successively formed in the gate groove 203.

Furthermore, the top of the gate conductive layer 220 is lower than the opening part of the gate groove 203, thereby constituting an accommodating space in the gate groove 203 and above the gate conductive layer 220. Moreover, the accommodating space is further filled with an insulation layer 230 to insulate and protect the gate conductive layer 220.

Still referring to FIG. 2, a well region W is further formed in the substrate 200, and the source region 201 and the drain region 202 are both formed in the well region W. In addition, an isolation layer 240 is further formed on the substrate 200; the isolation layer 240 covers the top surface of the substrate 200 that corresponds to the source region 201 and the source region 202 to prevent the source region 201 and the drain region 202 from being exposed from the top surface of the substrate 200, so as to isolate and protect the source region 201 and the drain region 202 and to avoid damages to the source region 201 and the drain region 202 caused during a follow-up production process.

FIG. 3 is a flow diagram of a transistor forming method in some embodiments of the present disclosure; and FIG. 4A to FIG. 4G are structural schematic diagrams of the transistor forming method in FIG. 3 in a preparation process thereof in some embodiments of the present disclosure. In addition, description of FIG. 3 and FIG. 4A to FIG. 4G is made in conjunction with the foregoing method of forming the semiconductor device having the transistor.

In some embodiments, the semiconductor device having the transistor as described above is a storage memory, and therefore, description of the memory forming method is made with reference to the figures in conjunction with the transistor forming method.

Figure 4A:
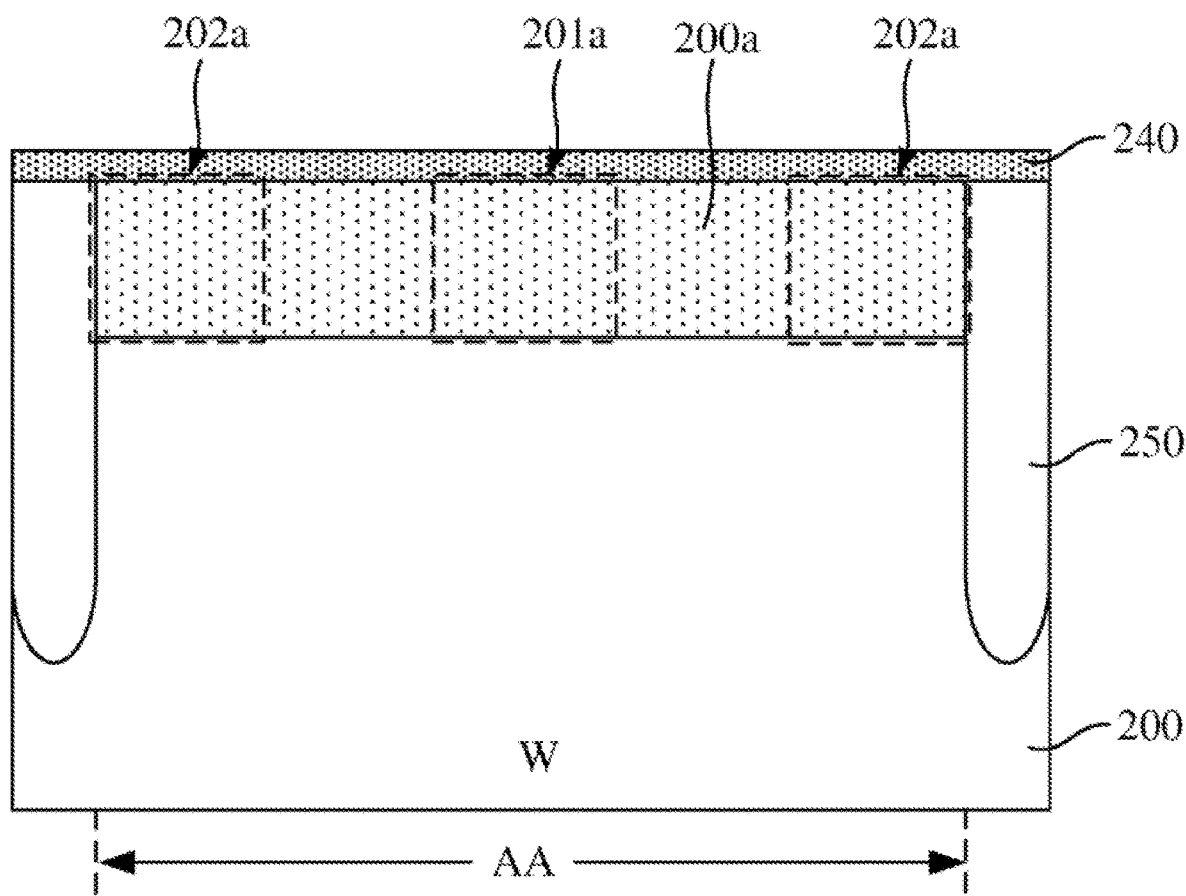
FIGS. 4A, 4B, 4C, 4D, 4E, 4F, and 4G are structural schematic diagrams of the transistor forming method in FIG. 3 in a preparation process thereof in some embodiments of the present disclosure.
Figure 4B:
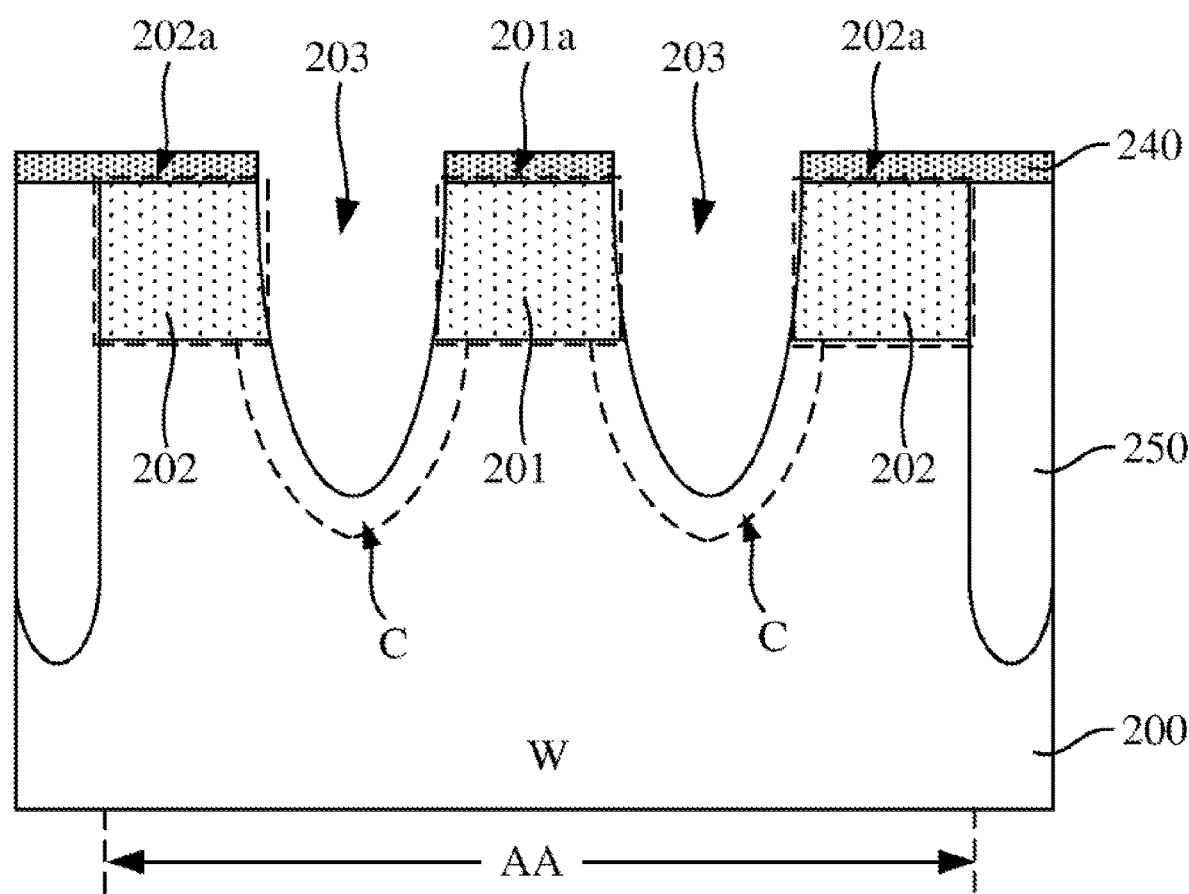

In step S100, as shown in FIG. 4A and FIG. 4B, a substrate 200 is provided; the substrate 200 has a first region 201a for forming a source region and a second region 202a for forming a drain region; and the part of the substrate 200 from the first region 201a to the second region 202a is used for constituting a channel region C of the transistor.

Furthermore, a well region W is formed in the substrate 200, and the source region and the drain region formed are both successively formed in the well region W. The source region and the drain region may be formed before a gate dielectric layer is formed. For example, the first region 201a and the second region 202a may be doped by means of an ion injection process in this step. The source region and the drain region may also be formed after a gate conductive layer is formed, that is, formed after a gate structure of the transistor is formed.

In some embodiments, the formed transistor is a groove-type transistor, and therefore, a gate groove is subsequently formed in the substrate 200. The steps of forming the source region, the drain region, and the gate groove may be combined to simplify the process.

In some embodiments, the forming of the source region, drain region, and gate groove include the following steps.

First, referring to FIG. 4A, an ion injection process is performed on the substrate 200 to form a doped region 200a in the substrate 200; the doped region 200a extends from the top surface of the substrate 200 to the inner part of the substrate 200; the first region 201a and the second region 202a both are doped with ions, and the doped region 200a is formed in the well region W; the doping concentration of the doped region 200a is greater than that of the well region W.

Second, referring to FIG. 4B, a gate groove 203 is formed in the substrate 200, and the gate groove 203 is used for separating the first region 201a and the second region 202a; the doped region located in the first region 201a is used for constituting the source region 201 and the doped region located in the second region 202a is used for constituting the drain region 202. Alternatively, the gate groove 203 is used for separating the doped region into multiple sections, and the doped region sections on two opposite sides of the gate groove 203 constitute the source region 201 and the drain region 202, respectively.

As shown in FIG. 4B, for the groove-type transistor, the part of the substrate 200 from the first region 201a (the source region 201) to the second region 202a (the drain region 202) is correspondingly the part of the substrate 200 surrounding the boundary of the gate groove 203 and from the source region 201 to the drain region 202. Hence, the formed channel region C of the groove-type transistor is a region surrounding the boundary of the gate groove 203.

In some embodiments, before performing the ion injection process, an isolation layer 240 is formed on the substrate 200, and the isolation layer 240 covers the top surface of the substrate 200. In this way, when performing the ion injection process subsequently to form a heavily doped region 200a, injected ions are injected into the substrate 200 through the isolation layer 240, preventing the injected ions from being directly injected from the exposed top surface of the substrate, thereby effectively reducing damages to the substrate caused by the ion injection process. When forming the gate groove 203 subsequently, an etching process is performed on the isolation layer 240 and the substrate 200 at the same time to form the gate groove 203 and enable remaining part of the isolation layer 240 to cover the part in the substrate 200 that corresponds to the source region 201 and the drain region 202.

In addition, in some embodiments, the formed transistor is used for constituting the memory transistor of the memory. Therefore, multiple active regions AA for forming the memory transistor can be defined on the substrate 200, and adjacent active regions AA are separated from each other by the separation structure 250. Furthermore, two memory transistors may be formed in one active region AA, and the two memory transistors may share the source region 201. For example, the source region 201 is formed between the two memory transistors.

Figure 4C:
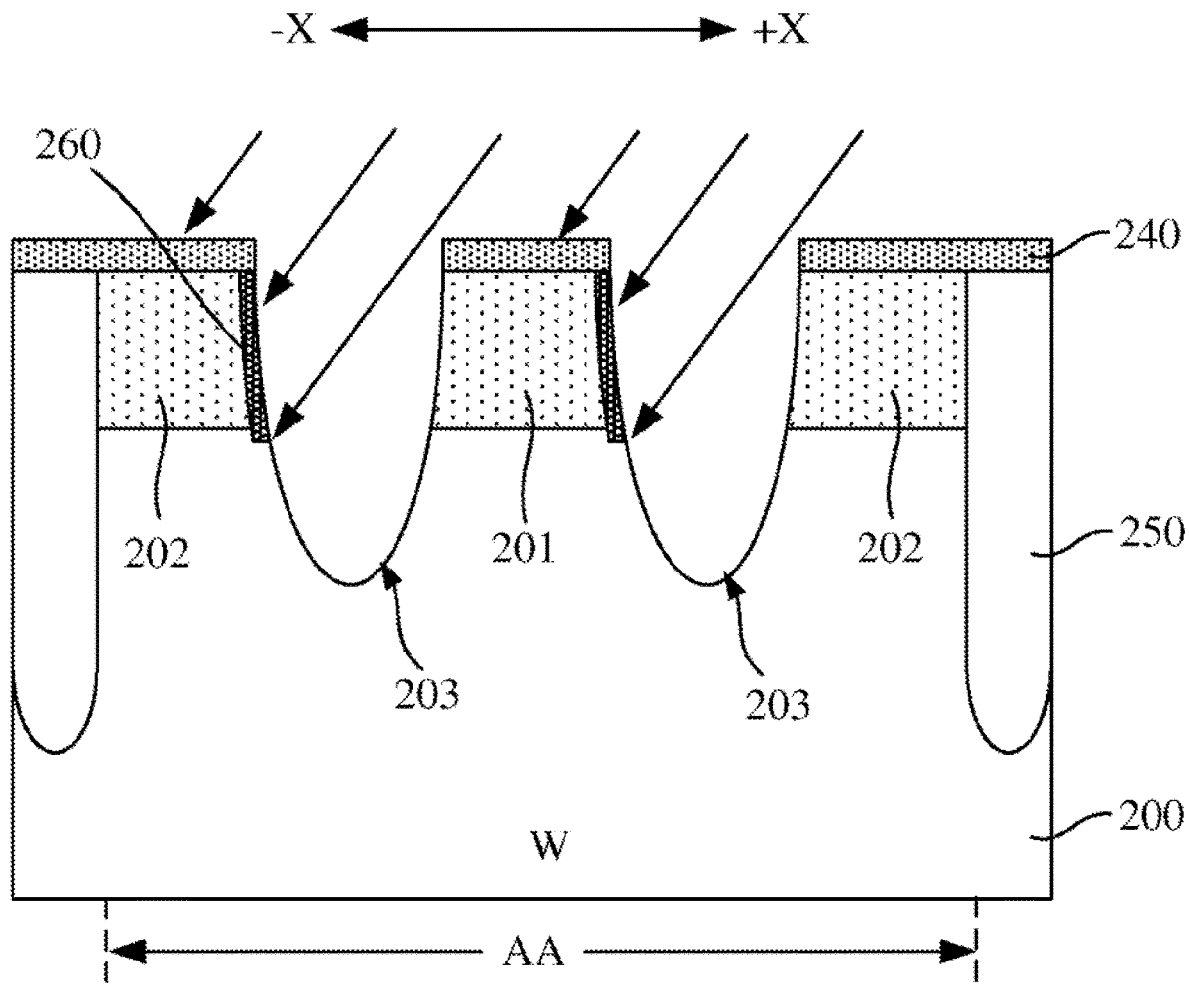
Figure 4D:
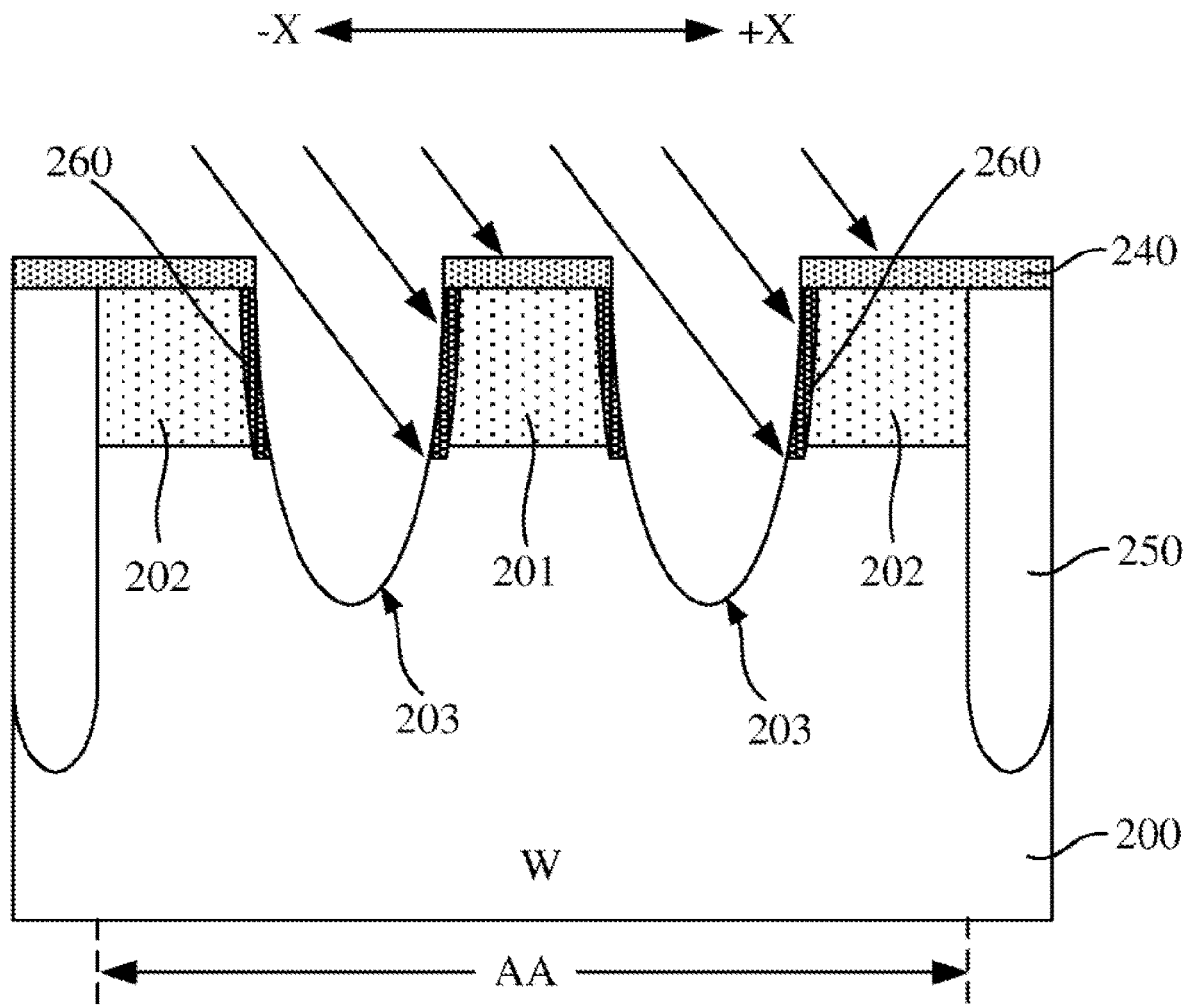
Figure 4E:
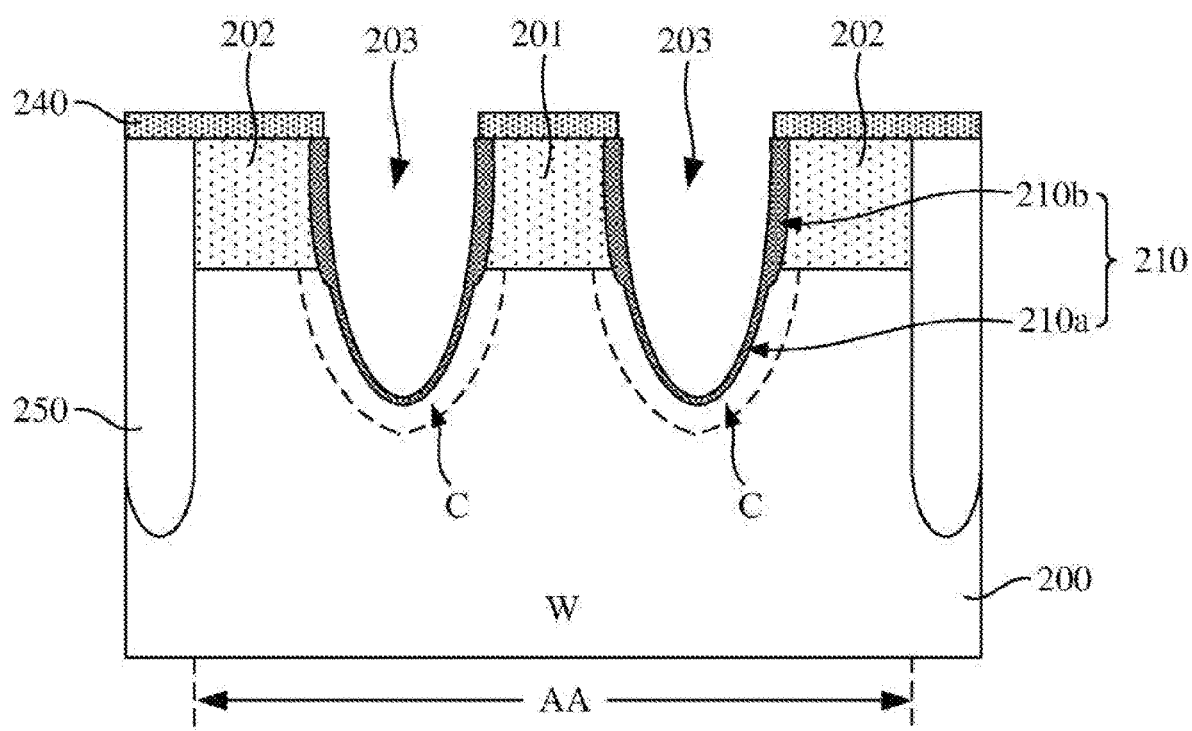

In step S200, as shown in FIG. 4C to FIG. 4E, a gate dielectric layer 210 is formed on the substrate 200; the gate dielectric layer 210 covers the part in the substrate 200 that corresponds to the channel region C and extends to cover the first region 201a and the second region 202a. In some embodiments, before the gate dielectric layer 210 is formed, the source region has been formed in the first region 201a and the drain region has been formed in the second region 202a already, and therefore, the gate dielectric layer 210 extends to cover the drain region 201 and the drain region 202.

The part of the gate dielectric layer 210 that corresponds to the channel region C constitutes a first portion 210a of the gate dielectric layer, the part of the gate dielectric layer 210 that covers the source region and the drain region constitutes a second portion 210b of the gate dielectric layer, and the average thickness of the second portion 210b of the gate dielectric layer is greater than that of the first portion 210a of the gate dielectric layer.

The formed gate dielectric layer 210 has different thicknesses at different positions. A preparation method of the gate dielectric layer 210 is provided as follows for controlling the thickness of the formed gate dielectric layer 210.

In the first step of forming the gate dielectric layer 210, as shown in FIG. 4C and FIG. 4D, an inclined ion injection process is performed at least twice to form a variation region 260 on sidewalls of the gate groove 203 adjacent to the opening part. The at least twice inclined ion injection process includes performing ion injection between the first region (the source region 201) and the second region (the drain region 202) in opposite deviation directions respectively, so as to form the variation region 260 on both the sidewall of the gate groove 203 adjacent to the source region 201 and the sidewall of the gate groove 203 adjacent to the drain region 202. For example, the at least twice inclined ion injection process includes performing ion injection in a direction toward the first region (the source region 201) and a direction toward the second region (the drain region 202). The part of the gate groove 203 adjacent to the source region 201 and adjacent to the drain region 202 herein includes: the part of the gate groove 203 that corresponds to the source region 201 and the drain region 202 in position.

For example, the variation region 260 is formed in the position in the gate groove 203 that is adjacent to the source region 201 and adjacent to the drain region 202. The variation region 260 has high oxidation efficiency during a following oxidation process, and therefore an oxidation layer with a greater thickness can be formed on the variation region 260.

Furthermore, the variation region 260 is, for example, a doped region doped with fluorine ions, and thus it has a faster oxidation speed. Correspondingly, injected ions of the inclined ion injection process include fluorine ions, or a process gas of the inclined ion injection process is fluorine-containing gas, for example, it may include boron fluoride (BF3).

In some embodiments, the transistor is used for constituting a memory transistor, and two memory transistors sharing a source region 201 are formed in an active region AA. A drain region 202, the source region 201, and another drain region 202 are successively arranged in an active region AA. Hence, during the process of performing an inclined ion injection process, as shown in FIG. 4C, the first inclined ion injection process is performed between the source region 201 and the drain region 202 towards a first direction (+X direction), where the first direction (+X direction) is a direction towards the source region 201 of a left transistor in FIG. 4C, while the first direction (+X direction) is a direction towards the drain region 202 of a right transistor in FIG. 4C. As shown in FIG. 4D, during the second inclined ion injection process, the ion injection process is performed between the source region 201 and the drain region 202 towards a second direction (−X direction), where the second direction (−X direction) is the direction opposite to the first direction (+X direction), and the second direction (−X direction) is a direction towards the drain region 202 of a left transistor in FIG. 4D, while the second direction (−X direction) is a direction towards the source region 2012 of a right transistor in FIG. 4D. In some embodiments, by means of the twice inclined ion injection process above, a variation region 260 is formed on both sidewalls of the gate groove 203 adjacent to the source region 201 and adjacent to the drain region 202.

In some embodiments, the variation region 260 further extends from the source region 201 and the drain region 202 to a part of the channel region C, such that the part of the channel region C adjacent to the source region 201 and the drain region 202 is also formed with the variation region 260. As shown in FIG. 4C and FIG. 4D, the variation region 260 passes through the boundaries of the source region 201 and the drain region 202 and continuously extends toward the center of the channel region C to a predetermined distance, where the center of the channel region C is the center of a current flowing path from the source region 201 to the drain region 202 in the substrate 200.

For the forming region of the variation region 260, an injection angle may be correspondingly adjusted during the inclined ion injection according to an opening size of the gate groove 203. For example, during the inclined ion injection process, an included angle between an ion beam and the substrate's surface is less than or equal to 80 degrees.

In the second step of forming the gate dielectric layer 210, as shown in FIG. 4E, an oxidation process is performed to form the gate dielectric layer 210 on the bottom and sidewalls of the gate groove. The part of the gate dielectric layer 210 that corresponds to the variation region 260 has a second thickness, the part of the gate dielectric layer 210 that does not correspond to the variation region 260 has a first thickness, and an oxidization rate of the part of the gate groove 203 that corresponds to the variation region 260 is greater than that of the part of the gate groove 203 that does not correspond to the variation region, so that the second thickness is greater than the first thickness.

As stated above, the variation region 260 is formed on the sidewalls of the gate groove 203 adjacent to the source region 201 and the drain region 202. For example, the variation region 260 is formed in both positions corresponding to the source region 201 and the drain region 202. Hence, the second portion 210b of the gate dielectric layer 210 that covers the source region 201 and the drain region 202 has the second thickness, while the first portion 210c of the gate dielectric layer 210 that corresponds to the channel region C at least has the first thickness.

In addition, in some embodiments, the variation region 260 further extends from the source region 201 and the drain region 202 to a part of the channel region C, and therefore, the first portion 210a on a region corresponding to the channel region C adjacent to the source region 201 and the drain region 202 also correspondingly has the second thickness. That is, the first portion 210a of the gate dielectric layer 210 has the first thickness and the second thickness, where the first portion 210a has the second thickness at a boundary of the channel region C, and from the boundary of channel region C to the center of the channel region C, the first portion 210a is reduced from the second thickness to the first thickness.

Hence, in the formed gate dielectric layer 210, the average thickness of the second portion 210b that covers the first region (the source region 201) and the second region (the drain region 202) can be greater than that of the first portion 210a that corresponds to the channel region C.

Figure 4F:
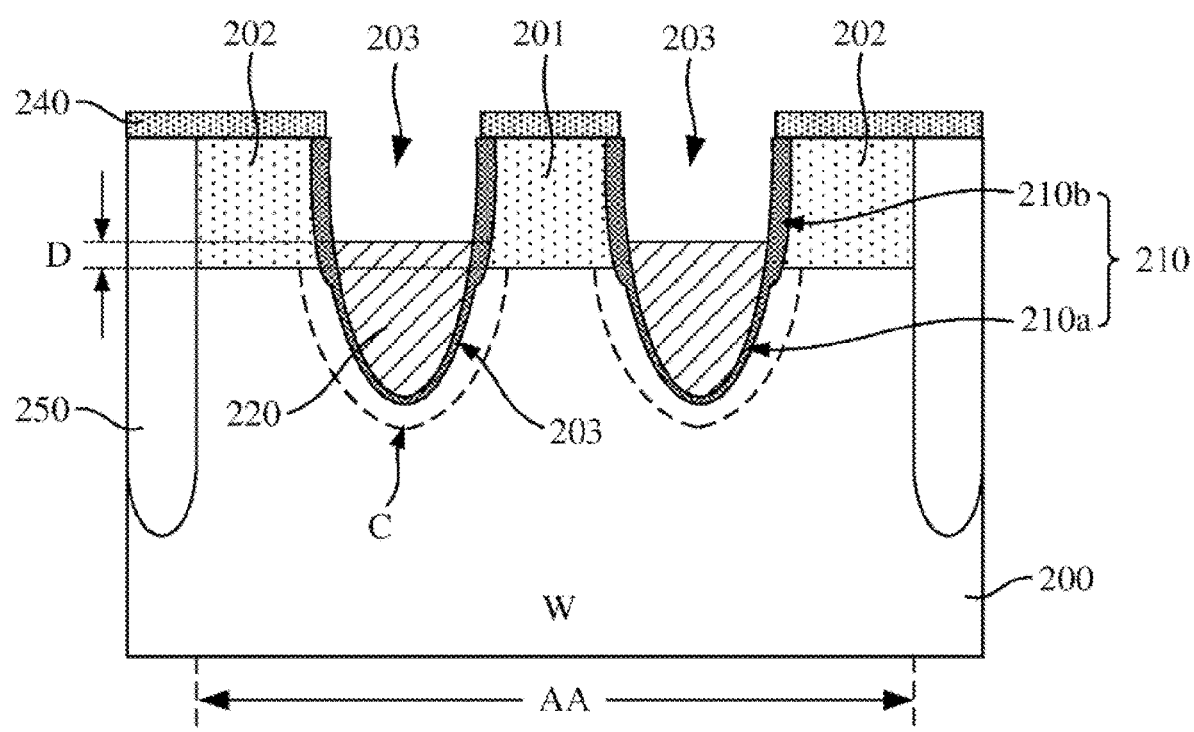
Figure 4G:
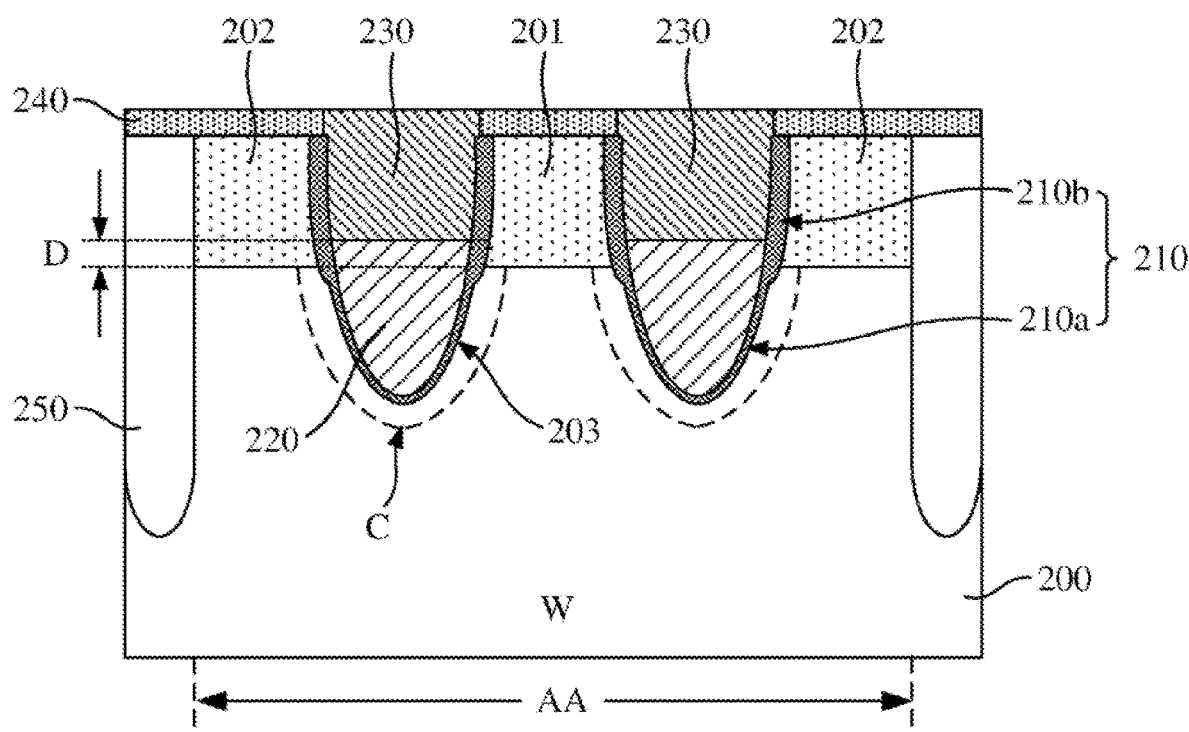

In step S300, as shown in FIG. 4F and FIG. 4G, a gate conductive layer 220 is formed on the gate dielectric layer 210 of the substrate 100. The gate conductive layer 220 extends from the first portion 210a to the second portion 210b of the gate dielectric layer 210 so that the gate conductive layer 220 has a region D overlapping with the first region (the source region 201) and the second region (the drain region 202) respectively.

As the second portion 210b of the gate dielectric layer 210 that covers the source region 201 and the drain region 202 has a greater thickness, the gate conductive layer 220 may be separated from the source region 201 and drain region 202 by the dielectric layer with the greater thickness. Hence, the formed transistor's GIDL may be relieved, so as to reduce the leakage current of the formed transistor. Moreover, on the basis of increasing the thickness of the second portion 210b of the gate dielectric layer 210, influences on the first portion 210a can be avoided, and therefore the switching performance of the formed transistor can still be ensured.

The forming steps of the gate conductive layer 220 are, for example:

step 1, forming a conductive material layer on the substrate 200, the conductive material layer covering the substrate 200 and filling the gate groove 203; and step 2, performing a back-etching process on the conductive material layer to remove the part of the conductive material layer that covers the substrate 200 and retain the part of the conductive material layer that fills the gate groove 203 to constitute the gate conductive layer 220.

Referring to FIG. 4F, in some embodiments, during the back-etching process of the conductive material layer, after the part of the conductive material layer that covers the substrate 200 is removed, the back-etching process can further be performed on the conductive material layer filled in the gate groove 203 to reduce the height of the conductive material layer. In this way, the top of the finally formed gate conductive layer 220 can be lower than an opening part of the gate groove 203 to form an accommodating space in the gate groove 203 and above the gate conductive layer 220.

Referring to FIG. 4G, after the gate conductive layer 220 is formed by filling, the steps may further include: filling an insulation layer 230 in the accommodating space of the gate groove 203 to cover the gate conductive layer 220. For example, the insulation layer 230 can be filled in the accommodating space by means of self-alignment, thereby insulating and protecting the gate conductive layer 220 by using the insulation layer 230.

Furthermore, the insulation layer 230 may be formed in the gate groove 203 by means of self-alignment using a planarization process (for example, chemical mechanical polishing processes). In some embodiments, the isolation layer 240 can be used as a polishing stop layer, and polishing stops at the isolation layer 240, so that a top surface of the formed insulation layer 230 is flush with a top surface of the isolation surface 240.

Embodiments in the present description are described in a progressive manner; each embodiment emphasizes differences from other embodiments; and the same or similar parts among the embodiments can be referred to among one another.

The description above only describes embodiments of the present disclosure, rather than limiting the scope of the present disclosure. Any change and modification made by those of ordinary skill in the art according to the disclosures above are within the scope of the claims.

The invention claimed is:

1. A transistor forming method, comprising:
providing a substrate, the substrate comprising a first region for forming a source region and a second region for forming a drain region;
forming a gate groove in the substrate to separate the first region and the second region, a part of the substrate along the bottom of the gate groove being used for constituting an embedded channel region of a transistor;
forming a gate dielectric layer on the gate groove of the substrate to cover the embedded channel region and to extend to cover a side of the first region and a side of the second region in the gate groove, wherein a part of the gate dielectric layer that covers the channel region constitutes a first portion of the gate dielectric layer, a part of the gate dielectric layer that covers the first region and the second region constitutes a second portion of the gate dielectric layer, the gate groove comprising a first part and a second part on the first part, the first part corresponding to the first portion of the gate dielectric layer, the second part corresponding to the second portion of the gate dielectric layer, and an average thickness of the second portion of the gate dielectric layer is greater than that of the first portion of the gate dielectric layer, wherein a depth of the second portion of the gate dielectric layer, measured from a top surface of the substrate, is larger than a depth of the source region and a depth of the drain region, and a width of the first part of gate groove, measured along a horizontal direction, is less than a width of the second part of the gate groove; and forming a gate conductive layer on the gate dielectric layer of the substrate and in the gate groove, the gate conductive layer extending from the first portion to the second portion of the gate dielectric layer so that the gate conductive layer has a region overlapping with the first region and the second region respectively.

2. The transistor forming method according to claim 1, wherein, before forming the gate groove, the method further comprises: performing an ion injection process on the substrate to form a doped region in both the first region and the second region of the substrate, the doped region extending from the top surface of the substrate to an inner part of the substrate; and after forming the gate groove, using the gate groove to separate the first region and the second region, and using the doped region in the first region to constitute the source region and the doped region in the second region to constitute the drain region.

3. The transistor forming method according to claim 1, wherein forming the gate conductive layer comprises:

forming a conductive material layer on the substrate, the conductive material layer covering the substrate and filling the gate groove; and performing a back-etching process on the conductive material layer, removing the part of the conductive material that covers the substrate and retaining the part of the conductive material layer that fills the gate groove to constitute the gate conductive layer.

4. The transistor forming method according to claim 1, wherein a top of the gate conductive layer is lower than an opening part of the gate groove, to form an accommodating space in the gate groove and above the gate conductive layer, and the transistor forming method further comprises:

filling an insulation layer in the accommodating space of the gate groove to cover the gate conductive layer.

5. The transistor forming method according to claim 1, wherein the average thickness of the first portion of the gate dielectric layer is less than 3 nm, and the average thickness of the second portion of the gate dielectric layer is greater than or equal to 3 nm.

6. The transistor forming method according to claim 1, wherein the first portion of the gate dielectric layer has a first thickness and a second thickness, the first portion of the gate dielectric layer has the second thickness at a junction of the overlapping region and the channel region, and from the junction of the overlapping region and the channel region to a center of the channel region, the first portion of the gate dielectric layer is reduced from the second thickness to the first thickness.

7. The transistor forming method according to claim 1, wherein forming the gate dielectric layer comprises:

performing an inclined ion injection process at least twice to form a variation region on sidewalls of the gate groove adjacent to an opening part, wherein the at least twice inclined ion injection process includes performing ion injection between the first region and the second region in opposite directions respectively, so as to form the variation region on both a sidewall of the gate groove adjacent to the first region and a sidewall of the gate groove adjacent to the second region; and performing an oxidization process to form the gate dielectric layer on a bottom and the sidewalls of the gate groove, wherein a part of the gate dielectric layer that does not correspond to the variation region has a first thickness, a part of the gate dielectric layer that corresponds to the variation region has a second thickness, and an oxidization rate of the part of the gate groove that corresponds to the variation region is greater than that of the part of the gate groove that does not correspond to the variation region, so that the second thickness is greater than the first thickness.

8. The transistor forming method according to claim 7, wherein the variation region extends from the first region and the second region to a part of the channel region, so that the part of the gate dielectric layer that corresponds to the channel region and is adjacent to the first region and the second region has the second thickness.

9. The transistor forming method according to claim 7, wherein injected ions of the inclined ion injection process comprise fluorine ions.

10. A semiconductor device, comprising a transistor formed according to the method of claim 1.

11. The semiconductor device according to claim 10, wherein the semiconductor device is a memory and the transistor constitutes a memory transistor of the memory, and wherein the memory has at least one active region, and the memory transistor is formed in the at least one active region.

12. The semiconductor device according to claim 11, wherein two memory transistors are within one of the at least one active region of the memory, and the two memory transistors share a source region.

* * * * *